United States Patent [19]

Khatibzadeh

[11] Patent Number: 5,095,285

[45] Date of Patent: Mar. 10, 1992

[54] MONOLITHICALLY REALIZABLE HARMONIC TRAPPING CIRCUIT

[75] Inventor: M. Ali Khatibzadeh, Plano, Tex.

[73] Assignee: Texas Instruments Incorporated, Dallas, Tex.

[21] Appl. No.: 576,636

[22] Filed: Aug. 31, 1990

[51] Int. Cl.$^5$ .................... H03F 3/04; H03H 7/01
[52] U.S. Cl. ..................... 330/306; 333/176; 333/32; 333/184
[58] Field of Search ............... 333/174–176, 333/181, 184, 185, 219, 204, 167, 32, 33; 330/306, 174, 176, 179, 251, 277, 286; 455/330, 333

[56] References Cited

U.S. PATENT DOCUMENTS

| | | | |
|---|---|---|---|
| 3,281,646 | 10/1966 | Khu et al. | 333/176 X |
| 3,461,372 | 8/1969 | Pickup et al. | 333/175 X |
| 3,859,542 | 1/1975 | Kennedy | 333/175 X |
| 4,264,881 | 4/1981 | De Ronde | 333/204 X |
| 4,433,315 | 2/1984 | Vandegraaf | 333/174 |
| 4,772,856 | 9/1988 | Nojima et al. | 330/306 X |
| 4,881,050 | 11/1989 | Swanson, Jr. | 333/184 X |
| 4,885,562 | 12/1989 | Ouvrard et al. | 333/185 X |
| 4,888,568 | 12/1989 | Kawaguchi | 333/174 |

FOREIGN PATENT DOCUMENTS 0292002 12/1987 Japan .................... 333/204

OTHER PUBLICATIONS

Snider, David M., *A Theoretical Analysis and Experimental Confirmation of the Optimally Loaded and Overdriven RF Power Amplifer*, IEEE Transactions on Electron Devices, vol. ED-14, No. 12, Dec. 1967, pp. 839-842.

Chiba, K. & Kanmuri, N., *GaAs FET Power Amplifier Module with High Efficiency*, (source unknown), Oct. 3, 1983.

Nishiki, S. & Nojima, T., *Harmonic Reaction Amplifier*, 1987 IEEE MTT-S Digest, pp. 963-966.

Primary Examiner—Eugene R. LaRoche
Assistant Examiner—Seung Ham
Attorney, Agent, or Firm—Richard A. Stoltz; Rene E. Grossman; Richard L. Donaldson

[57] ABSTRACT

A monolithically realizable harmonic trapping circuit that is a shunt connected series-resonant inductor-capacitor combination which has a resonant frequency designed to coincide with an undesired harmonic frequency of a desired fundamental frequency signal.

15 Claims, 6 Drawing Sheets $f_0$: 1.825 GHZ
$f_1$: 0.04500 GHZ
$f_2$: 2.00000 GHZ

MONOLITHICALLY REALIZABLE HARMONIC TRAPPING CIRCUIT

BACKGROUND OF THE INVENTION

1. Field of the Invention

The present invention relates to harmonic frequency filtering circuits, and, more particularly, to harmonic frequency filtering circuits monolithically realizable on a semiconductor substrate.

2. Description of the Related Art

Solid-state power amplifiers are frequently required to meet both high efficiency and low harmonics requirements simultaneously. In order to achieve high efficiency, such amplifiers are often designed to operate in nonlinear modes, such as class-B or -C, in which the output stage must be driven into compression. In such nonlinear modes, the active device (for example, a transistor) generates excessive levels of harmonics which are undesirable and must be filtered to improve the signal-to-noise ratio of the device. It has been shown (for example, D. M. Snider, "A Theoretical Analysis and Experimental Confirmation of the Optimally Loaded and Overdriven RF Power Amplifier", IEEE Transactions on Electron Devices, vol. ED-14, No. 12, Dec. 1967, pp. 851–857) that by terminating the even-order harmonics of the amplifier into a short-circuit (low impedance) while terminating the odd-order harmonics into an open-circuit (high impedance), one can achieve a high efficiency mode of operation (class-F) while at the same time filtering the unwanted harmonics from the output of the amplifier. In particular, the short-circuit termination of the second harmonic is important since it is usually the dominant harmonic.

Present commercial power amplifiers (such as those used in portable communication systems) often use hybrid thick-film circuit approaches to properly terminate the unwanted harmonics and achieve high efficiency modes of operation.

FIGS. 1a & 1b show schematic views of two conventional thick-film circuit approaches to harmonic termination of power amplifiers. The bipolar transistor is shown by way of example and the approaches are valid for other types of circuits.

In the approach of FIG. 1a, an AC grounded (by means of the bypass capacitor 60) quarter-wavelength (at the fundamental frequency) transmission line stub 62 shunts the output of the amplifier 100. At the fundamental frequency and its odd-order harmonics, the transmission line transforms the low impedance (short) of the capacitor 60 to a high impedance (open) at node 64. At even-order harmonics, however, the desired low impedance of capacitor 60 is presented to the output of the amplifier 100 at node 64.

FIG. 1b shows another thick-film circuit approach in which a parallel-resonant tank 70 is placed at a quarter-wavelength (at a quarter-wavelength (at the fundamental frequency) distance from the amplifier 100 output. The values of inductor 72 and capacitor 74, which constitute the parallel-resonant tank 70, are chosen to produce a resonant frequency that coincides with the fundamental frequency of the amplifier 100 according to the following relationship:

$$f_o = \frac{1}{2 \cdot Pi \, (L_o \cdot C_o)^{\frac{1}{2}}}$$

Since the tank circuit 70 is an open circuit at the resonant frequency, the fundamental RF frequency of amplifier 100 is unaffected by it. At harmonic frequencies, however, the tank circuit 70 is a low impedance capacitive termination. This low impedance is transformed by the quarter-wavelength transmission line 76 and is seen by amplifier 100, at node 78, as a low impedance at even-harmonic frequencies and as a high impedance at odd-harmonic frequencies.

The approaches illustrated in FIG. 1a & 1b are not applicable to monolithic integrated circuit technology, especially at UHF and low microwave frequencies, due to the large dimensions required for the quarter-wavelength transmission lines. Therefore, it can be seen that there is a need for a method for removing undesired harmonic signals from a circuit output that is compatible with monolithic integration.

SUMMARY OF THE INVENTION

The present invention provides a novel monolithically realizable harmonic trapping circuit that is of use in many types of analog RF circuits, particularly high efficiency solid-state power amplifiers. The harmonic trap consists of a series-resonant inductor-capacitor combination which has a resonant frequency designed to coincide with the undesired harmonic frequency. When used as a second harmonic trap in the output of a class-B solid-state power amplifier, it also presents a short-circuit to the second harmonic, thereby increasing the efficiency of the amplifier. The values of the inductor and capacitor in the harmonic trapping circuit can be easily realized even at UHF and lower RF frequencies using monolithic microwave integrated circuit (MMIC) technology. This makes monolithic fabrication of a high efficiency power amplifier with low harmonic levels feasible for high frequency applications (such as mobile communications).

DESCRIPTION OF THE PREFERRED EMBODIMENTS

Figure 1A:
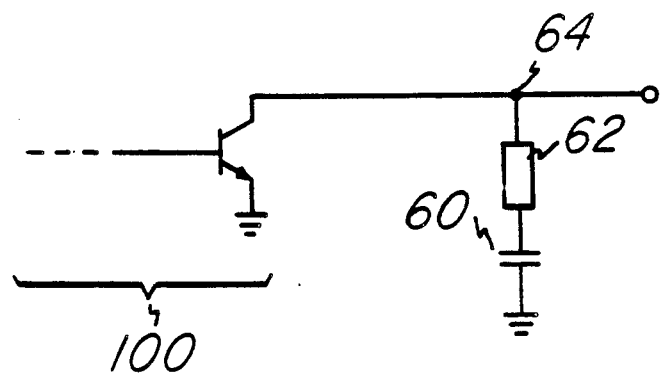
FIGS. 1a & 1b are schematic views of prior art thick-film circuits for reducing harmonic signal levels.
Figure 1B:
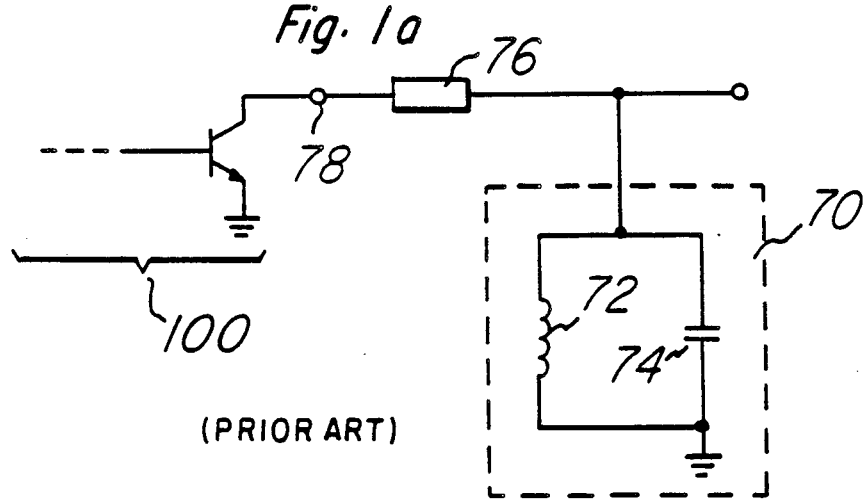
Figure 2:
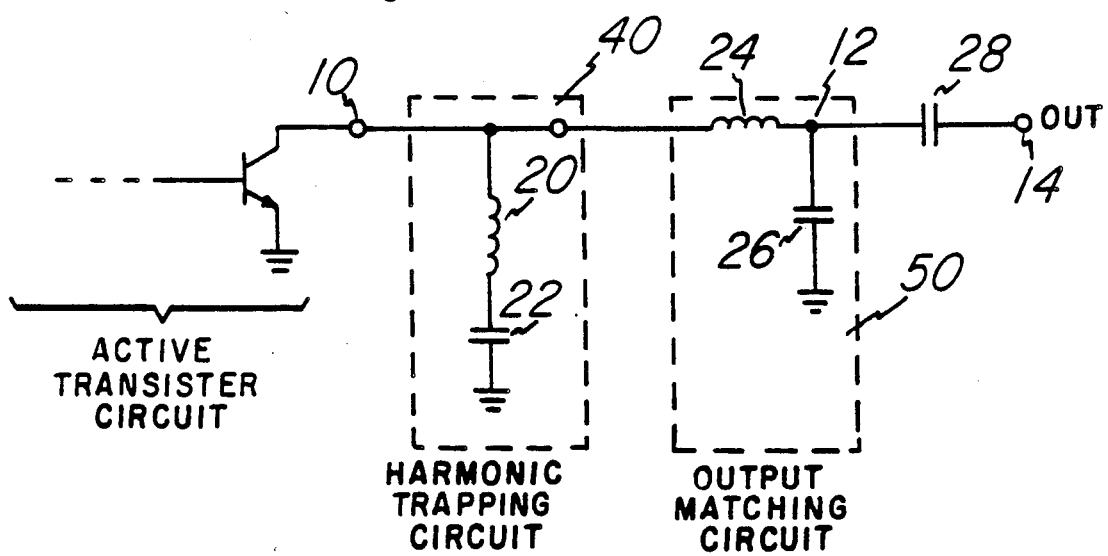
FIG. 2 is a schematic view of the monolithically realizable harmonic trapping circuit incorporated into a host circuit.

A first preferred embodiment of a monolithically realizable harmonic trapping circuit is illustrated schematically in FIG. 2, incorporated into a host circuit (an active host circuit is shown by way of example, but the harmonic trap could readily be incorporated into a passive circuit, such as a diode mixer).

The host circuit contains a terminal 10, for outputting a high frequency analog signal, to which is connected one side of an inductor 20. The other side of inductor 20 is connected to a capacitor 22. The other side of capacitor 22 is grounded. Inductor 20 and capacitor 22 together form a monolithically realizable harmonic trapping circuit 40. Terminal 10 is further connected to one side of an inductor 24, the other side of which is connected to a node 12. A capacitor 26 is connected between node 12 and ground. Inductor 24 and capacitor 26 together form an output matching network 50 of the host circuit. A blocking capacitor 28 is provided between node 12 and an output terminal 14.

In operation, the active transistor circuit of FIG. 2 outputs a fundamental frequency (f) signal at terminal 10, as well as several even and odd harmonics of the fundamental frequency due to the nonlinear mode of the circuit's operation. The second harmonic, or 2f, signal will normally have the largest magnitude of any of the harmonics, so consequently the harmonic trap 40 will be tuned to significantly attenuate this signal using the relation:

$$L_H = \frac{1}{4(Pi)^2(2f)^2 C_H}$$

Note that several different $L_H$-$C_H$ combinations can be used to achieve the second harmonic trap, depending on design constraints, if any, placed on component values. With the values of $L_H$ and $C_H$ properly chosen, the harmonic trap 40 will resonate at the second harmonic frequency 2f, presenting a short-circuit to ground to that signal, which will cause it to be greatly attenuated. Once past the harmonic trap 40, the signal passes through matching network 50 and DC blocking capacitor 28, where it is presented to output terminal 14.

At the fundamental frequency f, below resonance, the harmonic trap 40 is capacitive and this capacitance must be accounted for in the design of output matching circuit 50.

Figure 3:
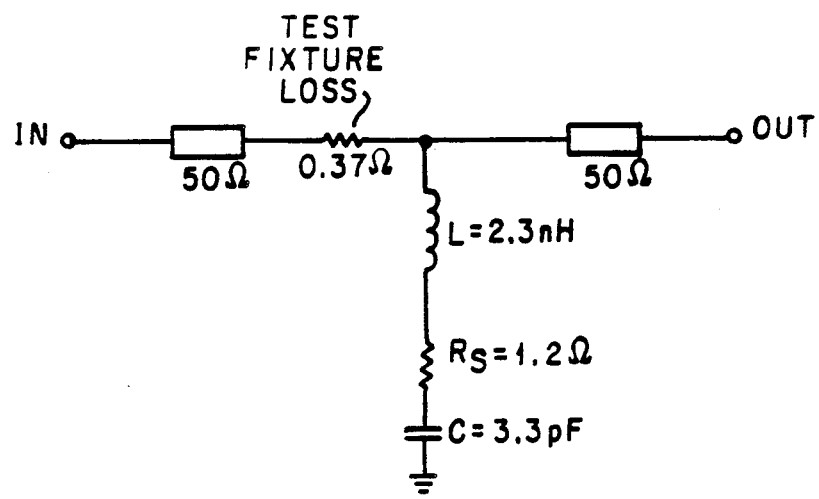
FIG. 3 is a schematic view of a test circuit used to make experimental measurements of the harmonic trapping circuit.

FIG. 3 shows a schematic view of a test circuit built by the inventor to allow measurements to be made of the harmonic trapping circuit 40 of FIG. 2. The test circuit was designed for application in a cellular communications device having a fundamental frequency of 870 MHz. The circuit was tuned to 1820 MHz (which is close to the actual second harmonic frequency 2f of 1740 MHz) due to the discrete nature of available capacitance values. In monolithic form, there is no such limitation and nearly exact capacitance values can be obtained. The 2.3 nH inductance was provided by a 110 mil (0.7 mil diameter) bond wire. $R_s$ of 1.2 Ohms represents the parasitic series resistance of the capacitor and the 0.37 Ohm resistance represents the measured test fixture loss.

Figure 4:
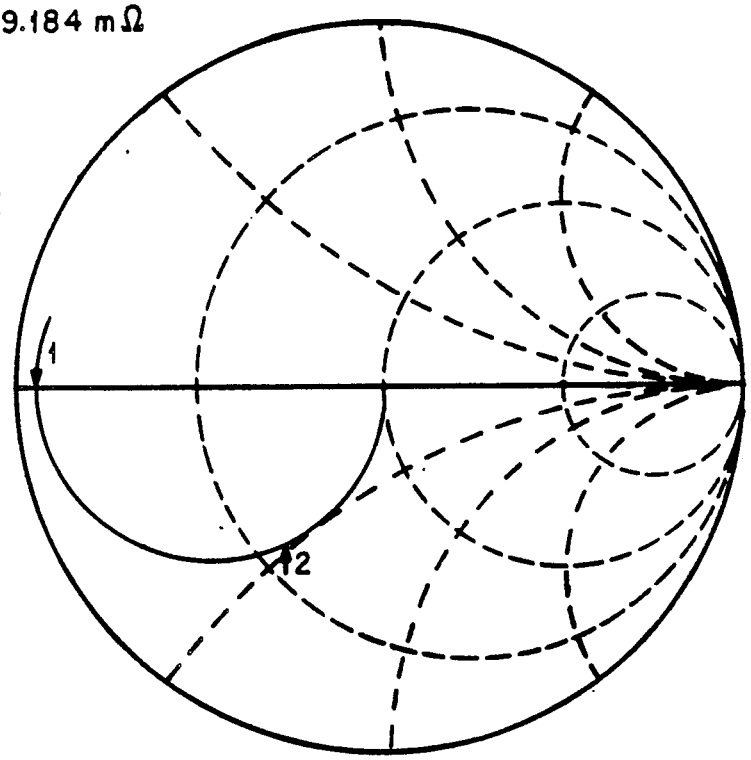
FIG. 4 is a Smith chart plot of the measured impedance of the test circuit of FIG. 3.

The measured impedance of the second harmonic trap of FIG. 3 is illustrated in FIG. 4. The measured frequency range is 45-2000 MHz. It can be seen that the total impedance at resonance (1820 MHz) is 1.56 Ohms, of which 1.19 Ohms is due to the resonant circuit and 0.37 Ohm is due to the test fixture loss. Note that at the fundamental frequency of 870 MHz (marker 2 in the Figure) the response is capacitive.

Figure 5:
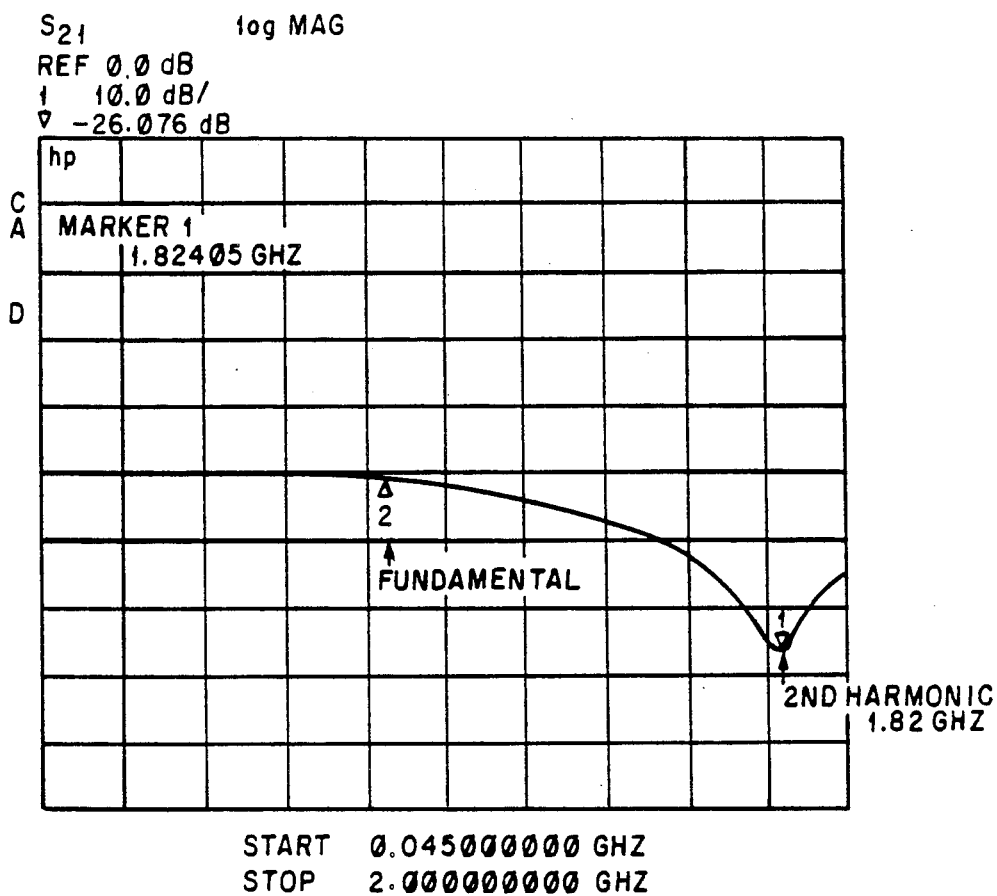
FIG. 5 is a plot of the measured insertion loss of the test circuit of FIG. 3.

FIG. 5 shows a plot of the measured rejection ($S_{21}$) of the second harmonic trap of FIG. 3 over a frequency range of 45-2000 MHz. The second harmonic at 1820 MHz is suppressed by 26 dB. The bandwidth coverage is more than sufficient for the cellular telephone application bandwidth of 825-915 MHz.

Figure 6:
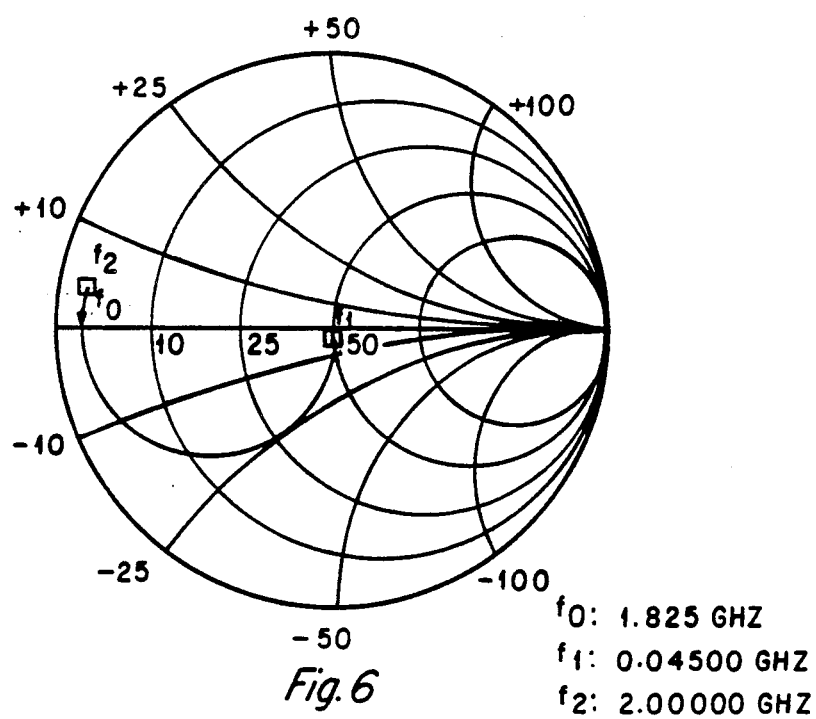
FIG. 6 is a Smith chart plot of the modeled impedance of the test circuit of FIG. 3.
Figure 7:
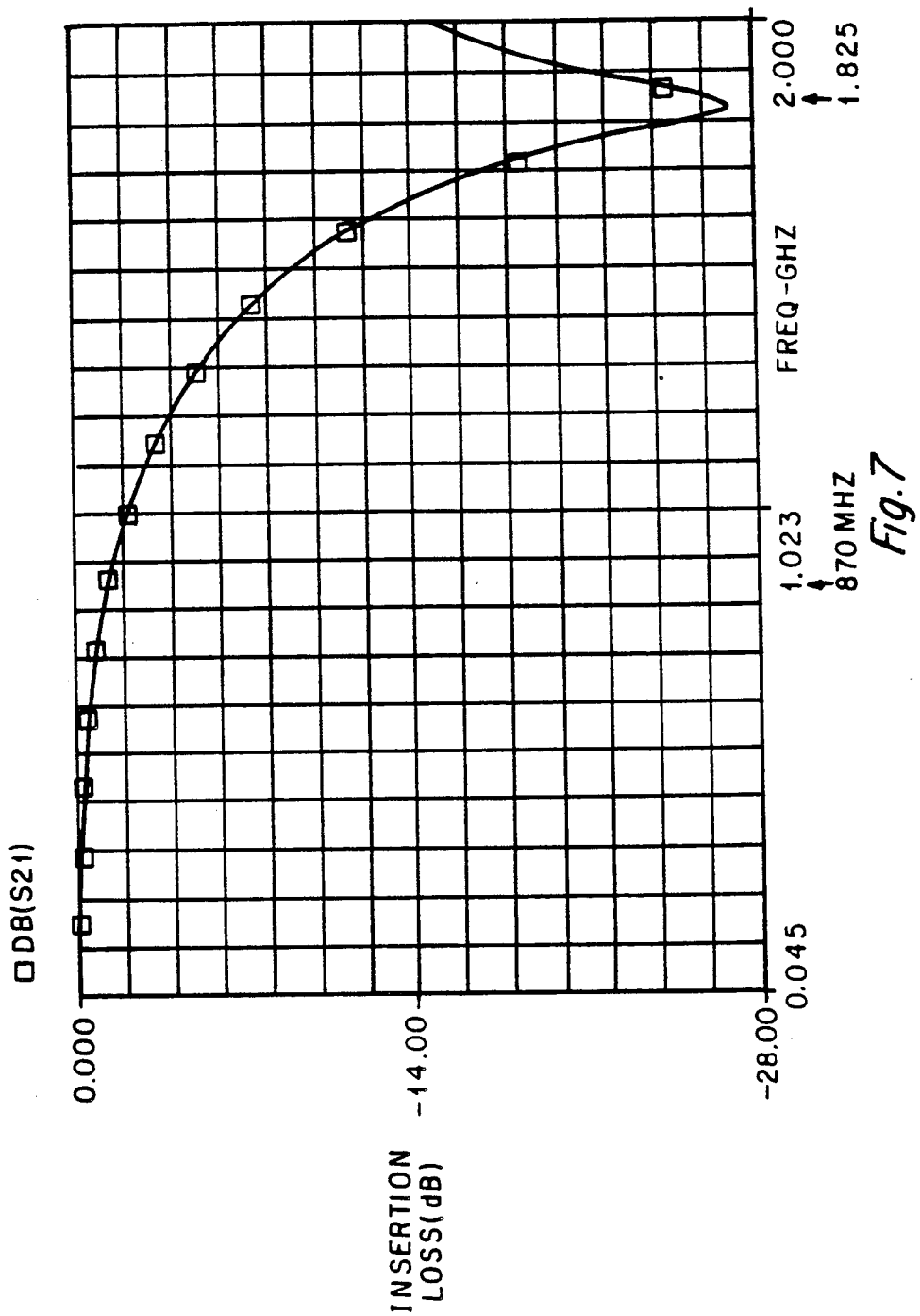
FIG. 7 is a plot of the modeled insertion loss of the test circuit of FIG. 3.

FIG. 6 and 7 show, respectively, the modeled impedance and the modeled insertion loss of the second harmonic trap of FIG. 3 (including the test fixture loss). Modeling was performed on EEsof Touchstone software. The suppression at the second harmonic of 1820 MHz was calculated to be 26.8 dB, while the loss at the fundamental frequency of 870 MHz due to $R_s$ was calculated to be 0.2 dB. For monolithic MIM (Metal-Isulator-Metal) capacitors, the loss will be even lower due to their lower parasitic series resistance.

Figure 8:
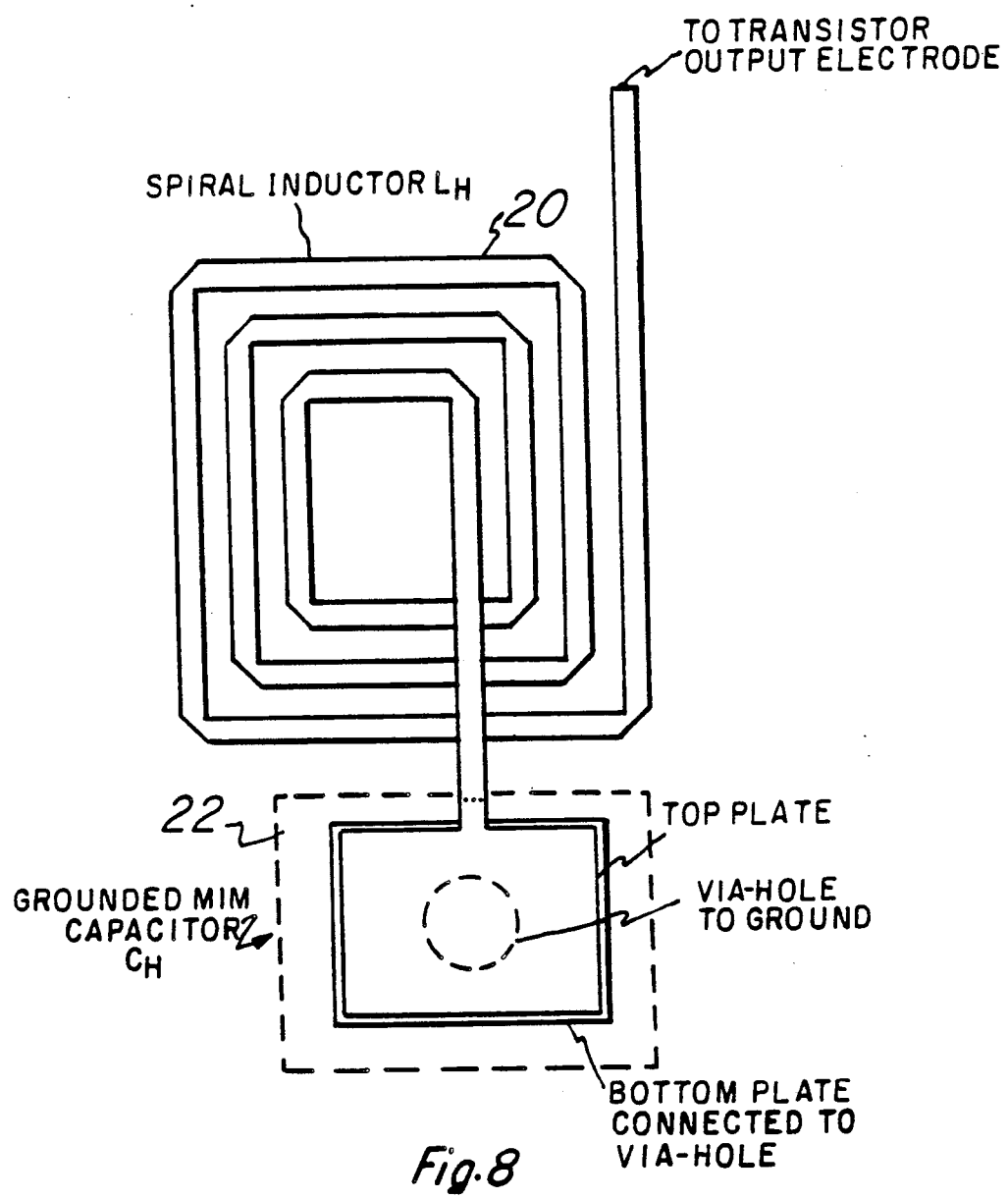
FIG. 8 is a plan view of a monolithic implementation of the harmonic trapping circuit 40 of FIG. 2.

FIG. 8 illustrates a possible configuration of the harmonic trapping circuit 40 of FIG. 2 in monolithic form on a suitable substrate or epitaxial layer such as GaAs. The inductor 20 is implemented as a spiral inductor patterned onto the semiconductor substrate or epitaxial layer by conventional processing methods, while capacitor 22 is implemented as a MIM capacitor.

MODIFICATIONS AND ADVANTAGES

Various modifications of the preferred embodiment of the invention may be made while retaining the basic features of the series-resonant harmonic trapping circuit.

Figure 9:
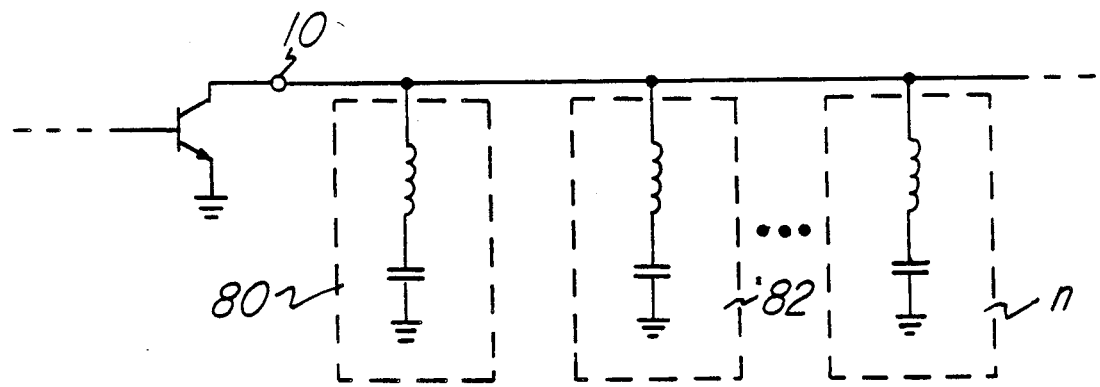
FIG. 9 is a schematic view of a first modification to the harmonic trapping circuit of FIG. 2.

In a first modification, the harmonic trapping circuit 40 of FIG. 2 is cascaded to form a separate trapping circuit for each of multiple harmonics, as illustrated in FIG. 9. For example, proper values of inductance and capacitance may be chosen such that trapping circuit 80 filters the second harmonic frequency, trapping circuit 82 filters the third harmonic frequency, and so on for as many harmonics as desired.

Figure 10:
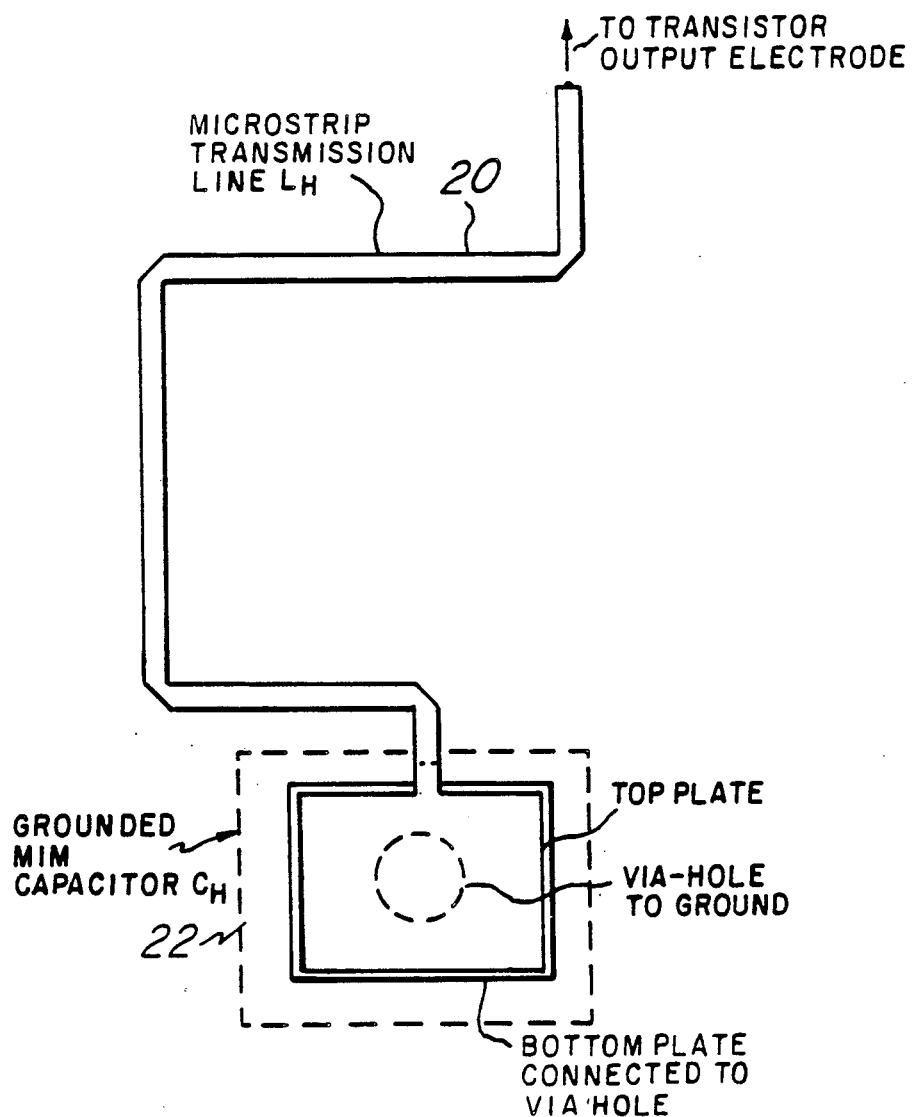
FIG. 10 is a plan view of a monolithic implementation of a second modification of the harmonic trapping circuit 40 of FIG. 2.

In a second modification, the spiral inductor 20 of the monolithic circuit of FIG. 8 may be realized instead by a section of microstrip or stripline transmission line, as shown in FIG. 10.

The advantages of the first preferred embodiment include its simplicity and its ability to be implemented as part of a MMIC, thereby minimizing the number of discrete, off-chip components required (which offers cost, space and reliability advantages).

What is claimed is:

1. An amplifier incorporating a monolithically realizable harmonic trapping circuit, said harmonic trapping circuit comprising:

an input terminal for receiving a desired radio frequency (RF) signal and its undesired harmonics;

inductive means having a first terminal connected to said input terminal;

capacitive means connected between a second terminal of said inductive means and ground; and an inductance of said inductive means and a capacitance of said capacitive means being of predetermined magnitudes to cause the series connection of said inductive means and said capacitive means to have a resonant frequency which is equal to a selected one of said undesired harmonics of said desired RF signal, thereby short circuiting said selected one of said undesired harmonics to ground, wherein a total capacitance of said harmonic trapping circuit at a non-resonant frequency is compensated for in an output matching circuit of said amplifier.

2. The amplifier of claim 1, wherein:

said inductive means is formed on a semiconductor surface; and said capacitive means is formed on said semiconductor surface.

3. The amplifier of claim 2, wherein:

said semiconductor is GaAs.

4. The amplifier of claim 2, wherein said inductive means is a planar spiral inductor.

5. The amplifier of claim 1, wherein said one of said undesired harmonics is a second harmonic.

6. The amplifier of claim 1, wherein:

said inductive means is formed on a first semiconductor surface; and said capacitive means is formed on a second semiconductor surface.

7. The amplifier of claim 2 wherein said semiconductor surface is a surface of an epitaxial layer.

8. The amplifier of claim 6 wherein:

said first semiconductor surface is a surface of a substrate; and said second semiconductor surface is a surface of an epitaxial layer.

9. Am amplifier incorporating a monolithically realizable harmonic trapping circuit, said harmonic trapping circuit comprising:

an input terminal for receiving a desired radio frequency (RF) signal and its undesired harmonics;

a plurality of inductive means having first terminals connected to said input terminal;

a plurality of capacitive means, each one of said plurality of capacitive means connected, respectively, between a second terminal of each one of said plurality of inductive means and ground; and a plurality of respective inductances of said plurality of inductive means and a plurality of respective capacitances of said plurality of capacitive means being of predetermined magnitudes to cause the series connection of respective ones of said inductive means and respective ones of said capacitive means to have respective resonant frequencies which are equal to a respective one of said undesired harmonics of said desired RF signal, thereby short circuiting said respective ones of said undesired harmonics to ground, wherein a total capacitance of said harmonic trapping circuit at a non-resonant frequency is compensated for in an output matching circuit of said amplifier.

10. The amplifier of claim 9, wherein:

each of said plurality of inductive means is formed on a semiconductor surface; and each of said plurality of capacitive means is formed on said semiconductor surface.

11. The amplifier of claim 10, wherein:

said semiconductor is GaAs.

12. The amplifier of claim 10, wherein each of said plurality of said inductive means is a planar spiral inductor.

13. The amplifier of claim 9, wherein:

said plurality of inductive means is formed on a first semiconductor surface; and said plurality of capacitive means is formed on a second semiconductor surface.

14. The amplifier of claim 10 wherein said semiconductor surface is a surface of an epitaxial layer.

15. The amplifier of claim 13 wherein:

said first semiconductor surface is a surface of a substrate; and said second semiconductor surface is a surface of an epitaxial layer.

* * * * *